United States Patent
Cho et al.

(10) Patent No.: US 8,604,826 B2
(45) Date of Patent: Dec. 10, 2013

(54) BIAS COMPENSATION METHOD AND SYSTEM FOR MINIMIZING PROCESS, VOLTAGE AND TEMPERATURE CORNER VARIATIONS

(75) Inventors: Junho J. H. Cho, San Jose, CA (US); Chihou C. L. Lee, Stouffville, CA (US)

(73) Assignees: Advanced Micro Devices, Inc., Sunnyvale, CA (US); ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 13/328,322

(22) Filed: Dec. 16, 2011

(65) Prior Publication Data

US 2013/0154684 A1    Jun. 20, 2013

(51) Int. Cl.
| H03K 17/16 | (2006.01) |
| H03K 19/003 | (2006.01) |
| H03K 3/00 | (2006.01) |
| H03B 1/00 | (2006.01) |
| G05F 3/16 | (2006.01) |
| G05F 3/20 | (2006.01) |
| G05F 3/08 | (2006.01) |

(52) U.S. Cl.
USPC ............. 326/33; 326/30; 326/34; 327/108; 323/312; 323/315

(58) Field of Classification Search
USPC ............. 326/30, 32–34; 327/535, 540, 541
See application file for complete search history.

(56) References Cited

U.S. PATENT DOCUMENTS

| 5,128,564 A | 7/1992 | Harvey et al. | |
| 6,175,267 B1 | 1/2001 | Bree et al. | |
| 7,301,371 B2 * | 11/2007 | Kim | 326/82 |
| 7,733,163 B1 | 6/2010 | Li | |
| 7,902,883 B2 * | 3/2011 | Hidaka | 327/108 |
| 7,990,178 B2 * | 8/2011 | Liu et al. | 326/83 |
| 8,222,954 B1 * | 7/2012 | Ren et al. | 327/539 |
| 2003/0193350 A1 * | 10/2003 | Chow | 326/83 |
| 2004/0137676 A1 * | 7/2004 | Kim et al. | 438/200 |
| 2004/0246026 A1 * | 12/2004 | Wang et al. | 326/86 |
| 2005/0134303 A1 * | 6/2005 | Best et al. | 326/30 |
| 2007/0115034 A1 * | 5/2007 | Nguyen et al. | 327/112 |
| 2008/0186053 A1 * | 8/2008 | Malekkhosravi et al. | 326/38 |
| 2011/0138036 A1 * | 6/2011 | Tyree | 709/224 |

* cited by examiner

Primary Examiner — Shawki Ismail
Assistant Examiner — Dylan White
(74) Attorney, Agent, or Firm — Volpe and Koenig, P.C.

(57) ABSTRACT

A system and method for calibrating bias in a data transmission system including a calibrated bias having impedance calibration for accommodating parameter variations in the data transmission system. A current mirror receives and balances bias currents between the calibrated bias and an output driver from the data transmission system. A digital compensation logic circuit is connected to the calibrated bias to adjust the calibrated bias for variations in parameters causing a current tail effect. A calibration logic circuit adjusts calibration due to variations in operational parameters, such that the tail current variations are minimized.

11 Claims, 13 Drawing Sheets

| CAL (decimal) | PSW<1> | PSW<2> | PSW<3> | PSW<1: 2^{N-1}> ......... | PSW<2^{N-3}> | PSW<2^{N-2}> | PSW<2^{N-1}> |
|---|---|---|---|---|---|---|---|
| $2^{N-1}$ | 0 | 0 | 0 | 0 | 0 | 0 | 0 |
| $2^{N-2}$ | 0 | 0 | 0 | 0 | 0 | 0 | 1 |
| $2^{N-3}$ | 0 | 0 | 0 | 0 | 0 | 1 | 1 |
| ......... | ......... | ......... | ......... | ......... | ......... | ......... | ......... |
| 2 | 0 | 0 | 1 | 1 | 1 | 1 | 1 |
| 1 | 0 | 1 | 1 | 1 | 1 | 1 | 1 |
| 0 | 1 | 1 | 1 | 1 | 1 | 1 | 1 |

FIG. 3

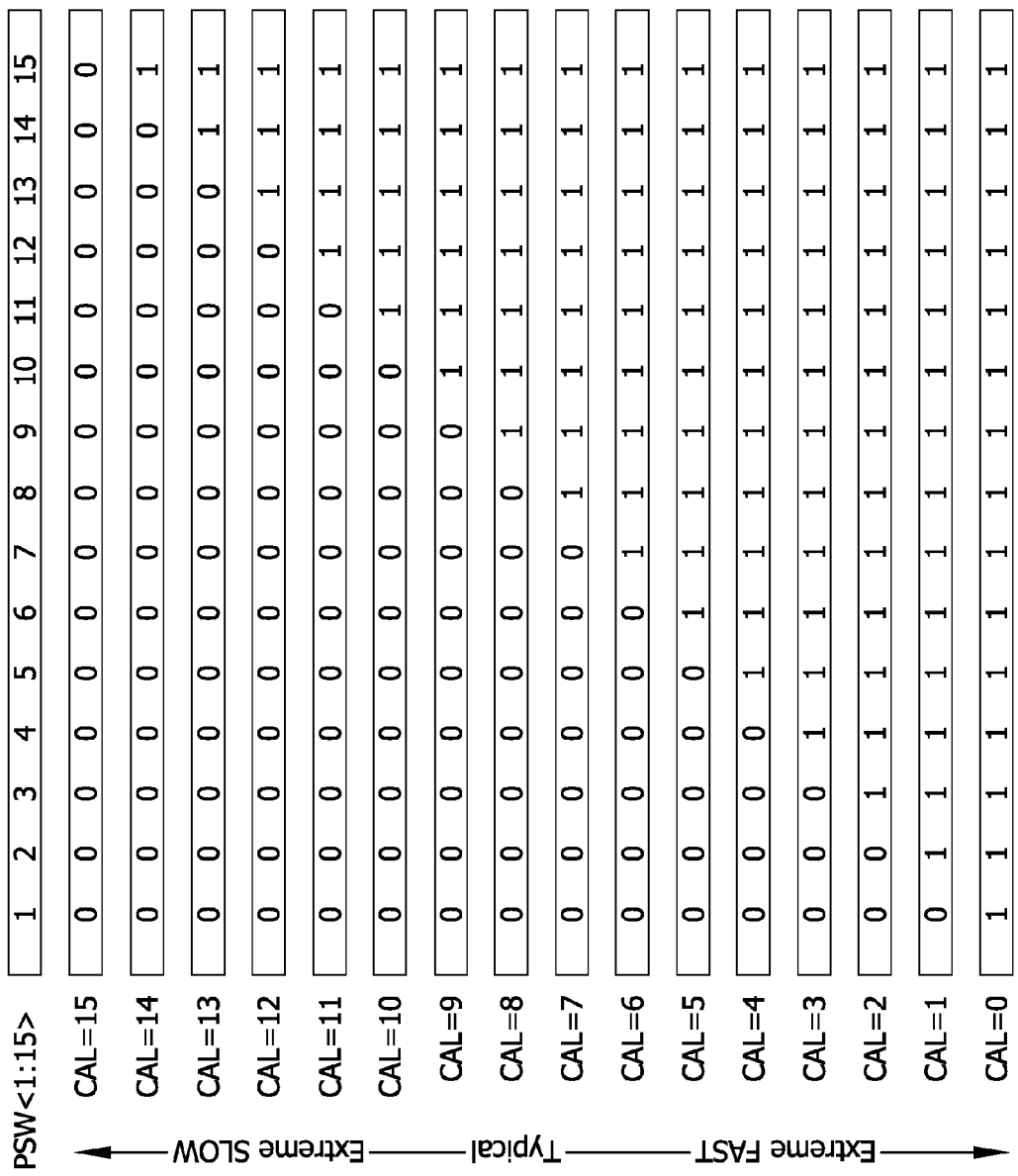

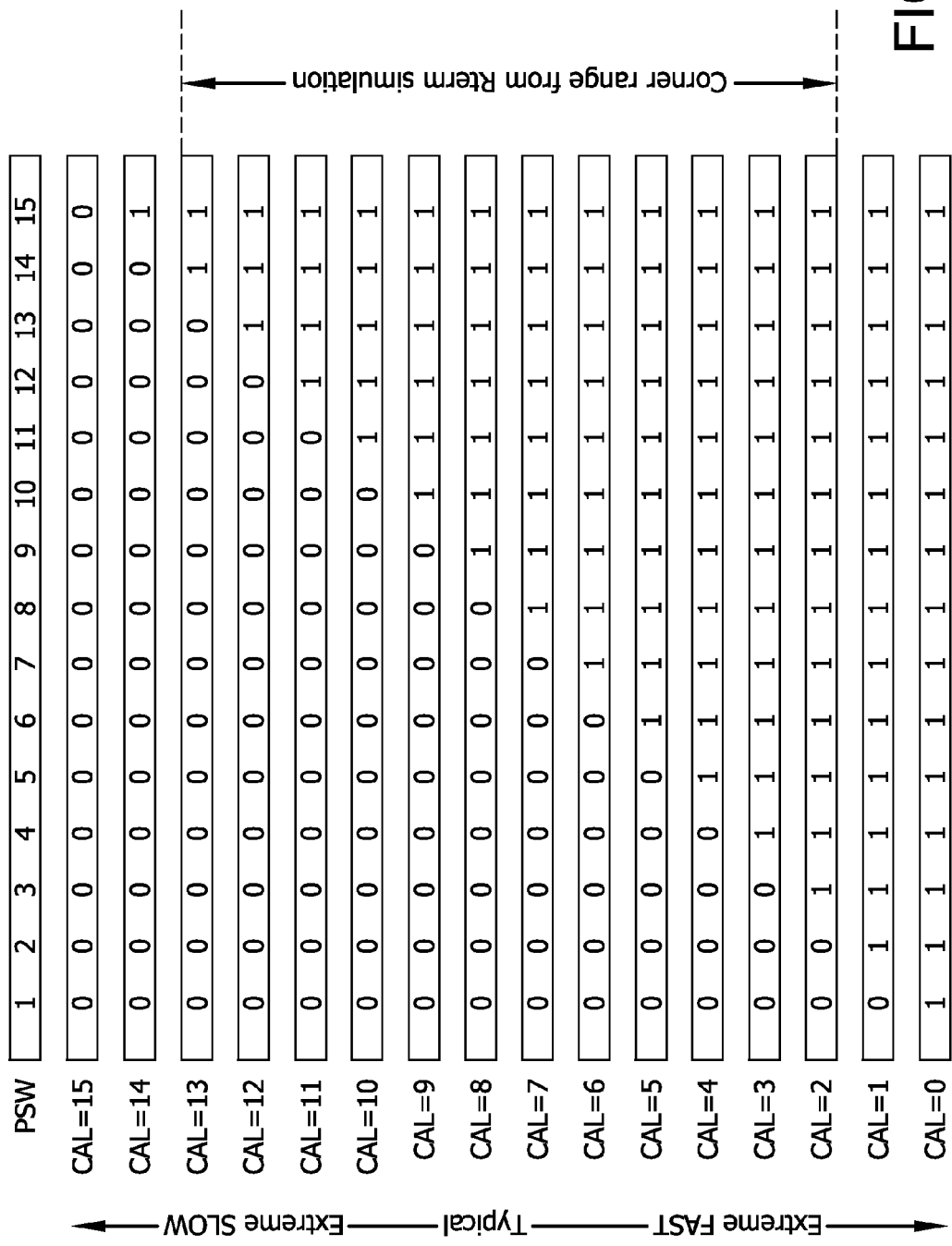

BIAS COMPENSATION METHOD AND SYSTEM FOR MINIMIZING PROCESS, VOLTAGE AND TEMPERATURE CORNER VARIATIONS

FIELD OF INVENTION

The present invention relates to bias compensation and more specifically to minimizing process, voltage and temperature corner variations using bias compensation.

BACKGROUND

Serial data transmission systems often are adopted as high speed data transmission methods to overcome the limits of data transmission rates of conventional parallel data transmission systems. Generally, a serial data transmission system adopts a differential signal structure to increase noise immunity and uses current mode structure in the transmitter to support various voltage swings with common mode voltage level requirements. The voltage swing and common mode voltage level in the current mode differential pair generally depend on the tail current source, and the accurate bias current through using the tail current source in order to meet the specifications of the voltage swing and common mode level. In such a serial data interface, signal integrity often can depend on the matching between the transmitter and receiver's termination impedances. Without accurate impedance matching the signal propagated from the transmitter to the receiver can experience significant undesirable distortion due to reflected waves as the bit error rate of data transmission increases.

Considering PVT (Process, Voltage and Temperature) variations in semiconductor manufacturing of serial data transmission systems, where PVT corners represent the extremes of these parameter variations within which a circuit must function correctly, it will be appreciated that a circuit running on devices fabricated at these process corners may run slower or faster, and at lower or higher temperatures and voltages than specified. Thus, in light of PVT variations it is not practicable to design a system on the assumption that there are no variations in voltage swing, common mode voltage level and impedance. Although the variation of the termination impedance can be reduced through calibration techniques, the variations in voltage swing and common mode voltage can still occur due to the variations from the tail current source of the differential pair.

One conventional solution to prevent current tail variation from voltage swing and common mode voltage variation is to use a cascoded-structured current mirror. The cascoded structure may be constructed from two transistors such as NMOS (n-type metal oxide semiconductor), with one operating as a common emitter or common source and the other as a common base or common gate. Such a conventional cascoded-structure may be duplicated for each leg of current mirrored differential pair. In such a configuration, the tail current has large output impedance by virtue of stacked transistors and the current becomes relatively insensitive to common mode voltage variation. However, such cascoded-structures require greater headroom margin, which effectively limits the achievable maximum voltage swing. In general, the differential voltage swing of high speed serial data transmission is 0.4V~1.2V and in such a large voltage swing mode, the compensation circuit incorporating the stacked transistors can suffer from a lack of voltage headroom. The lack of headroom can become severe when PVT variations result in an extreme slow process speed with low voltage; thereby, diminishing the usefulness of this solution in serial data transmission systems.

Thus, the need exists for a way to reduce or eliminate the effects of variations from the tail current source in serial data transmission systems for situations involving PVT variations.

SUMMARY OF EMBODIMENTS

A system and method for calibrating bias in a data transmission system includes a calibrated bias having impedance calibration for accommodating parameter variations in the data transmission system. A current mirror receives and balances bias currents between the calibrated bias and an output driver from the data transmission system. A digital compensation logic circuit is connected to the calibrated bias to adjust the calibrated bias for variations in parameters causing a current tail effect. A compensation logic circuit adjusts calibration due to variations in operational parameters, such that the tail current variations are minimized.

A system for stabilizing output in a data transmission system has a stabilizing circuit connected to an output driver of the data transmission. The stabilizing circuit includes a digital compensation logic circuit to control corner variations.

A bias compensation circuit for use in a calibrated data transmission system has a compensation logic circuit operative to vary a bias current used in a current mirror to stabilize an output driver of the transmission system. The compensation logic circuit is responsive to an n-bit digital signal representative of a corner state.

A method for use in a data transmission circuit includes establishing current mirror between a reference current and an output current of an output driver; varying the reference current by a varying impedance associated with differences in operation parameters; and adjusting the variations in the reference current by differences between the data transmission circuit and preferred operational parameters.

BRIEF DESCRIPTION OF THE DRAWING(S)

Other aspects, advantages and novel features of the invention will become more apparent from the following detailed description of the invention when considered in conjunction with the accompanying drawings wherein:

FIG. 3 is a truth table of a thermometer decoder according to the present invention;

Figure 1:
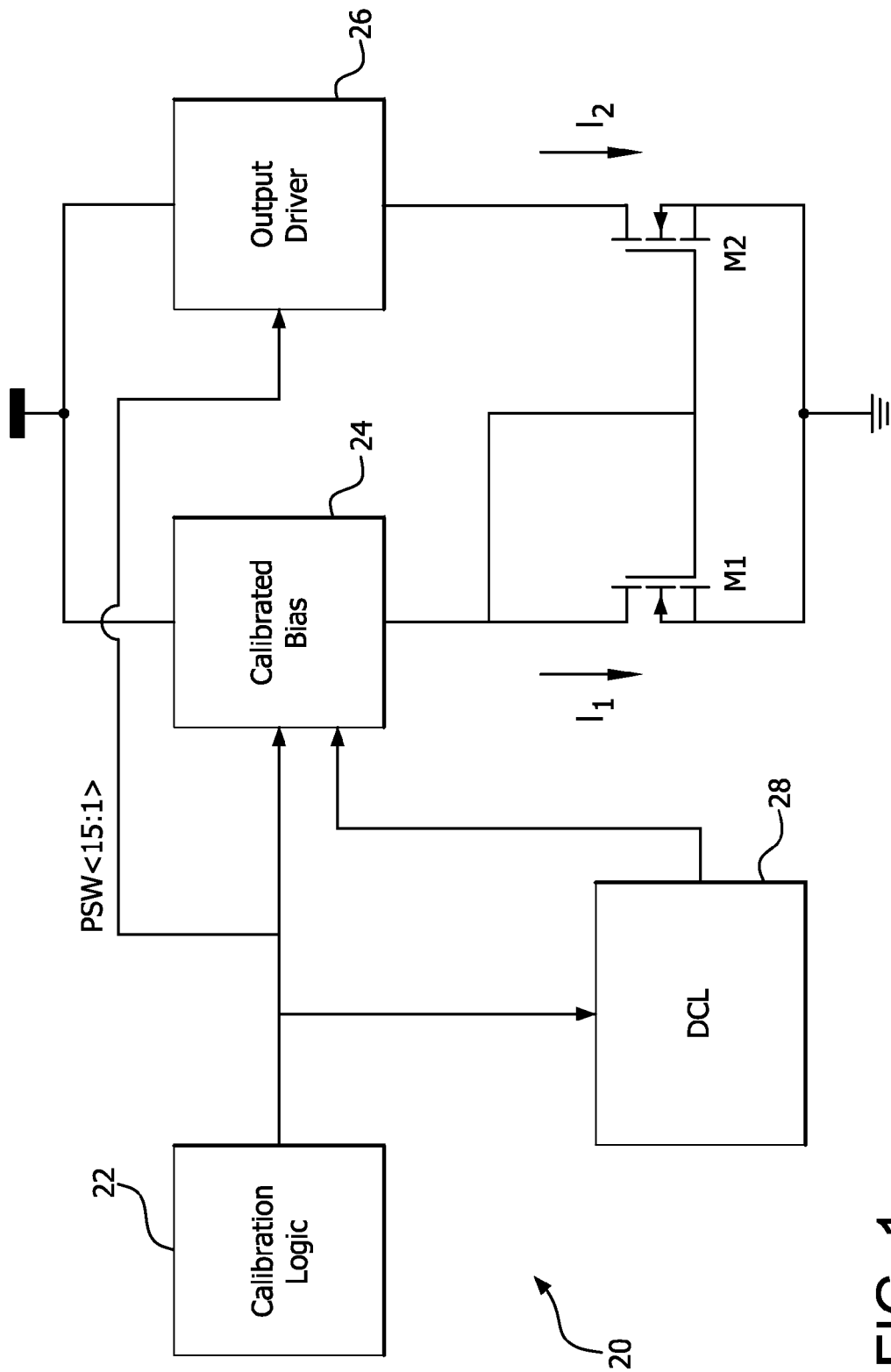
FIG. 1 is a block diagram of bias compensation circuit according to the present invention.
Figure 9:
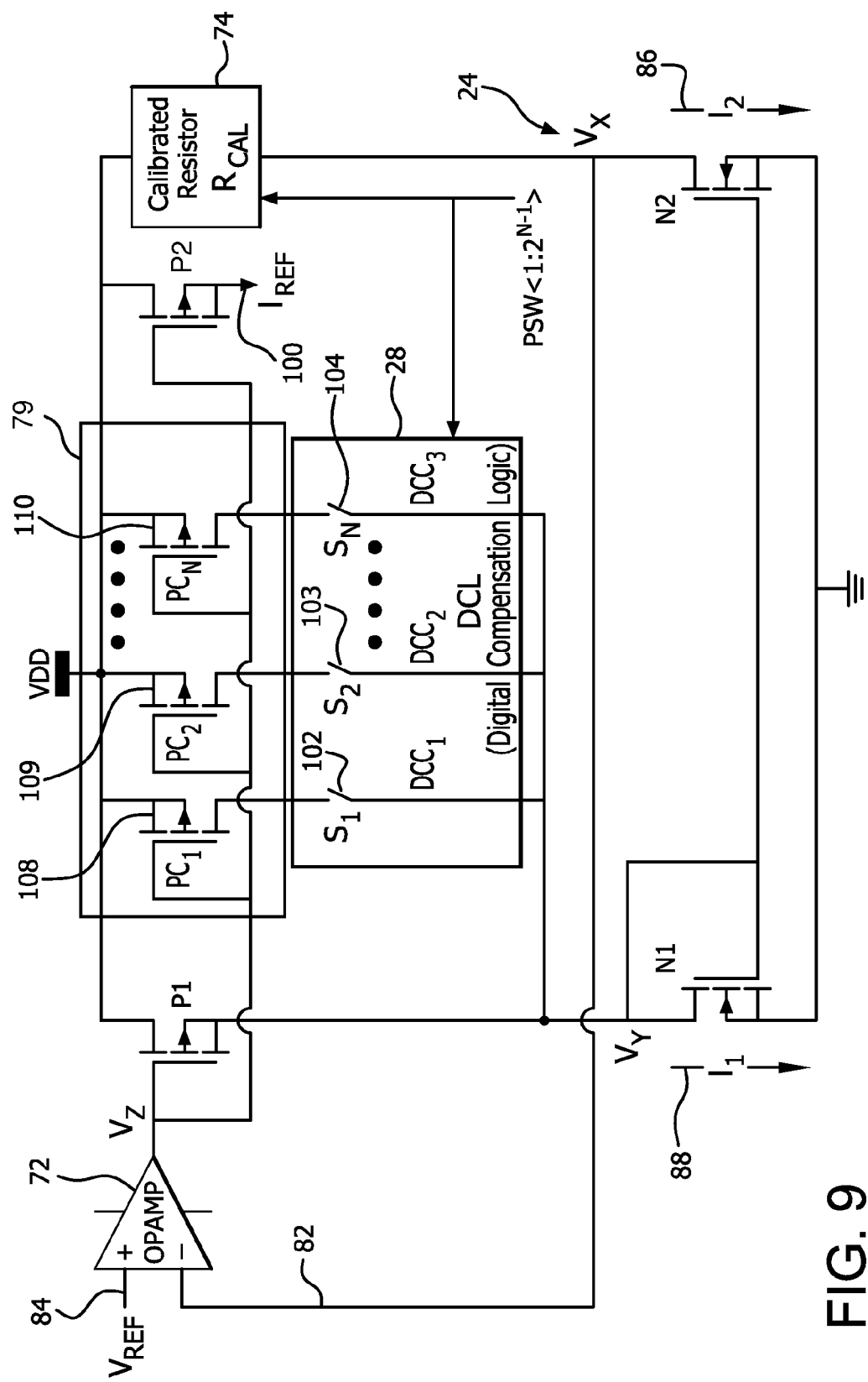
Figure 10:
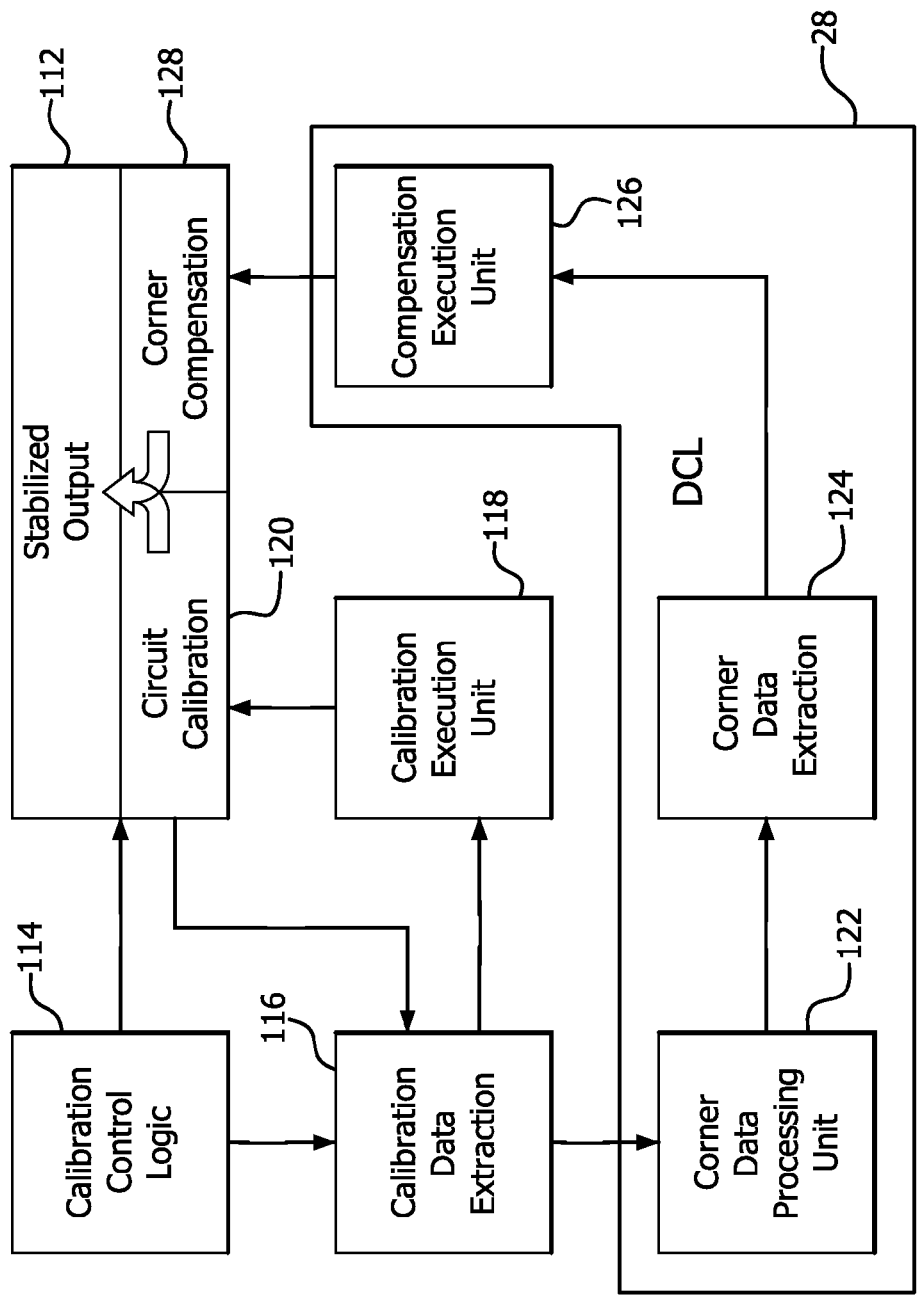

FIG. 8A-D are logic tables for implementing the digital compensation logic of FIG. 1 according to the present invention;

FIG. 9 is a block diagram of a circuit integrating the calibrated bias with a representative digital compensation logic circuit of FIG. 1 according to the present invention; and FIG. 10 is a simplified block diagram of a circuit integrating the calibrated bias with a digital compensation logic circuit of FIG. 1 according to the present invention.

DETAILED DESCRIPTION OF THE PREFERRED EMBODIMENT(S)

The present disclosure relates to minimizing variations from the tail current source of the differential pair, which in turn minimizes variations in voltage swing and common mode voltage. When used with current calibration techniques to generate accurate impedance, the impact of PVT variations in process, voltage and temperature on variations in voltage swing, common mode voltage level and impedance is minimized.

Advantageously, a new bias compensation method and apparatus is disclosed to minimize the variations of the tail current source of the differential pair by combining impedance calibration and selecting an appropriate calibration result. This technique can be directly applied to new serial data transmission system designs or to existing serial data transmission system designs.

In a one configuration, a method and apparatus to select an appropriate calibration result is provided by digital compensation logic.

With reference to the drawing for purposes of illustration, FIG. 1 shows a bias calibration circuit 20 which includes a calibration logic circuit 22 that generates a digital code comprised of digital bits, PSW<1:2N−1>, to digitally calibrate impedance and bias current for current in a differential pair M1 and M2 including a calibration bias circuit 24 and output driver 26. The calibration logic circuit 22, while fit for its intended purpose, alone fails to account for any variations originating from current mirrors placed between the calibration bias circuit 24 and output driver 26. Advantageously, DCL (Digital Compensation Logic) circuit 28 is added to generate DCC (Digital Compensation Code) to further adjust the bias circuit in order to compensate for the variations in output driver's tail current 12, across the PVT (Process, Voltage, Temperature) corners.

Figure 2:
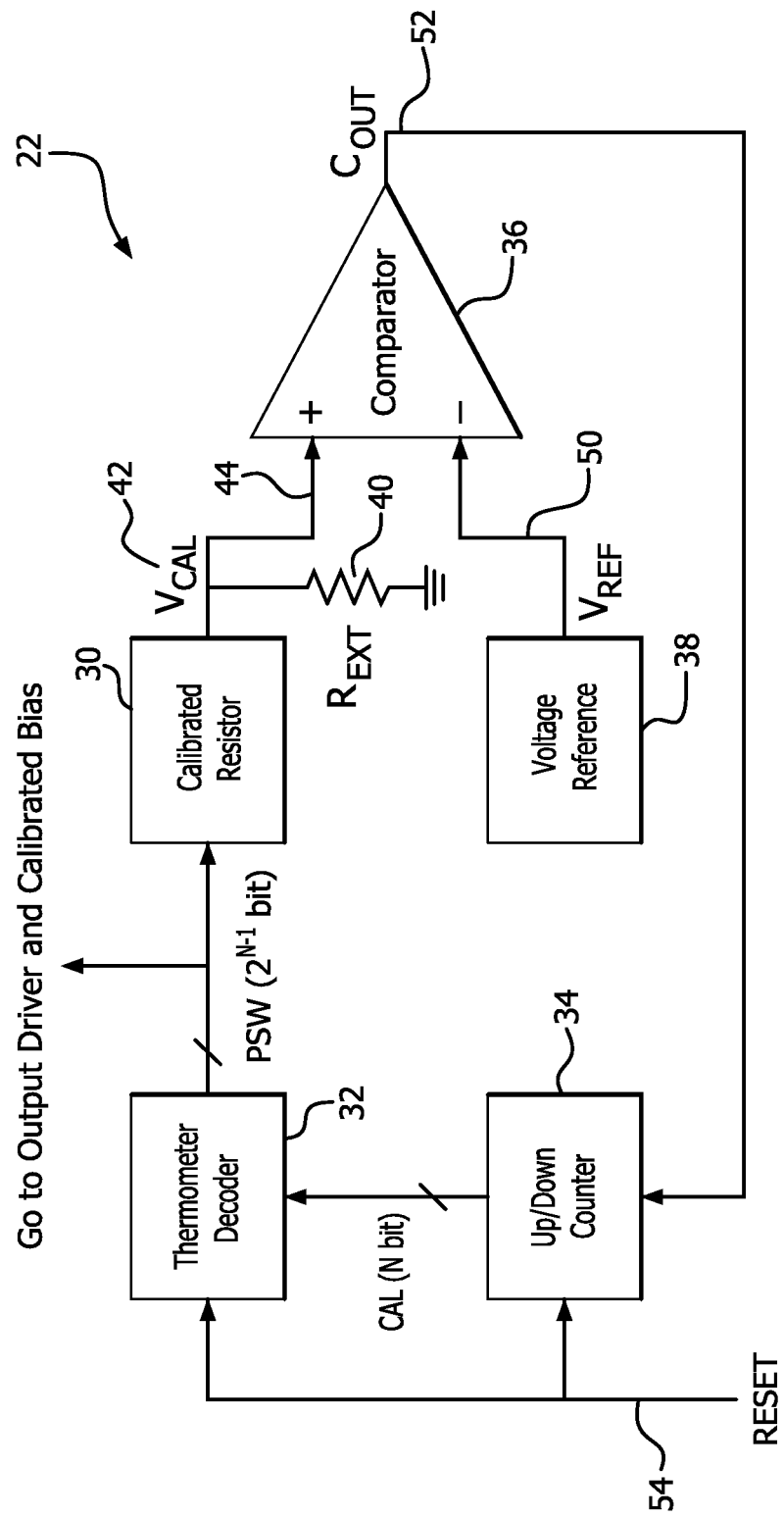
FIG. 2 is a block diagram of a calibration logic circuit of FIG. 1 according to the present invention.

The calibration logic circuit 22 (FIG. 2), also referred to herein as a calibration block, includes a calibrated resistor 30 that is controlled by a feedback loop which comprises of thermometer decoder 32, up/down counter 34, comparator 36 and voltage reference 38. A precise external resistor (REXT) 40 connects in series to the calibrated resistor 30 and forms a voltage divider to generate a calibrated voltage ($V_{CAL}$) 42 from calibrated resistor 30 when measured across the external resistor and ground. The calibrated voltage 42 connects to a positive input 44 of comparator 36 for comparison with a voltage reference ($V_{REF}$) 38 that connects at the comparator's negative input 50. The resulting output of the comparator (Cout) 52 then provides the input to the up/down counter 34 of the feedback loop. N-bit thermometer decoder 32 generates $2^{N-1}$ bit thermometer code (PSW) from N bit output (CAL) of up/down counter 34 to set the resistance of calibrated resistor 30. Initially CAL is set to any value by RESET signal received from an external source at lead 54 and is increased or decreased depending on Cout 52.

A truth table 56 (FIG. 3) of thermometer decoder 32 illustrates the logical relationship of the decimal value of CAL to the number of logic '0' in PSW<1:$2^{N-1}$>.

Figure 4:
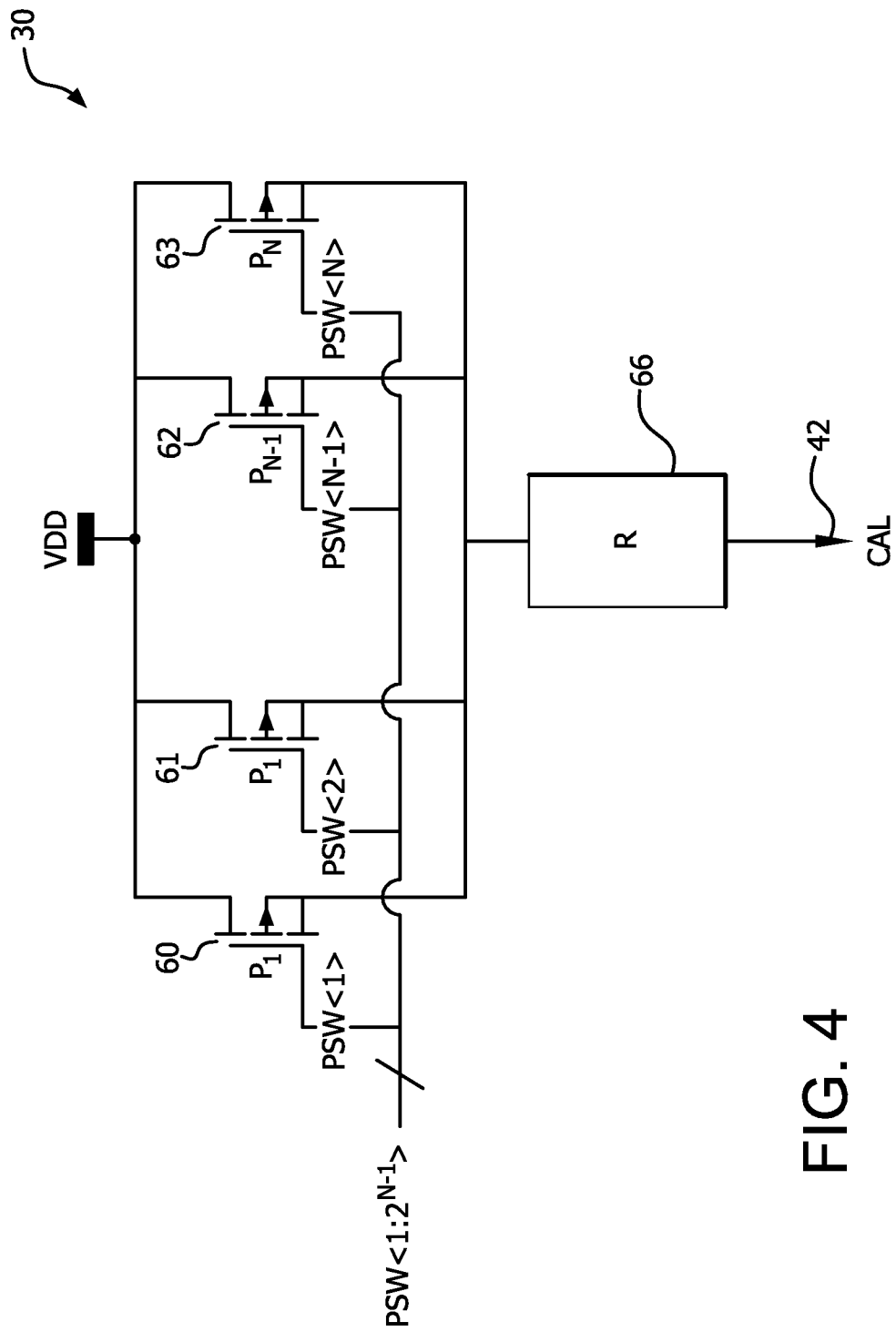
FIG. 4 is a block diagram of a calibrated resistor circuit of FIG. 2 according to the present invention.

The calibrated resistor 30 (FIG. 4) includes an array of PMOS switches ($P_1 \sim P_N$) 60-63 and resistor R 66. The total resistance of calibrated resistor 30 is determined by the combination of turned-on PMOS switches 60-63 arranged in parallel, which contributes an effective resistance based on the channel resistance of each PMOS, and the combination is connected in series with resistor R 66. Turned-on PMOS switches may be determined from the truth table 56 by the number of logic '0's corresponding to the value of CAL. It should be noted that any MOSFET array can be used as this circuit design is not intended to be limiting to a PMOS design solution and an NMOS circuit design could be implemented as well.

With reference again to FIG. 2, the comparison between $V_{CAL}$ 42 and $V_{REF}$ 38 is executed in the comparator 36. The following is the transfer function of the comparator 36.

IF $V_{CAL}$>$V_{REF}$ THEN $C_{OUT}$='high'

ELSE $C_{OUT}$='low'

Figure 5:
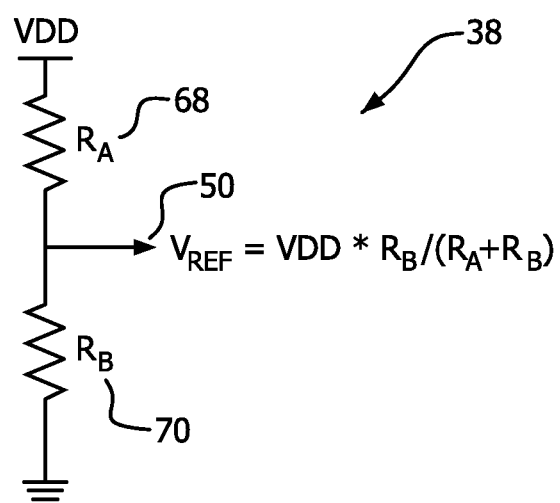
FIG. 5 is voltage reference circuit of FIG. 2 according to the present invention.

$V_{REF}$ 50 is generated from voltage reference 38. The voltage reference 38 (FIG. 5) is a voltage divider using resistors 68 and 70 in series. It will be appreciated by those skilled in the art, accurate biasing current relies upon precision of resistors $R_A$ 68 and $R_B$ 70 to produce an accurate voltage $V_{REF}$ 50 in the voltage reference 38 and in relation to the accuracy $V_{CAL}$ 42 which depends on the accuracy of external resistor $R_{EXT}$ 40. In a one embodiment, external resistor $R_{EXT}$ 40 is an external resistor out of chip, which permits the selection of the resistor after chip fabrication to accommodate any differentials from the desired values of resistors $R_A$ 68 and $R_B$ 70 for which the attempted accuracy of external resistor $R_{EXT}$ 40 is about less than 5%.

With reference again to FIG. 2, the Up/down counter 34 counts one N-bit upward and downward depending on $C_{OUT}$ 52 state. The logic value 'high' and 'low' of $C_{OUT}$ 52 makes up/down counter count downward and upward, respectively. While $V_{CAL}$<$V_{REF}$, $C_{OUT}$ 52 keeps 'low' and up/down counter 34 counts upward. On the other hand, while $V_{CAL} \geq V_{REF}$, $C_{OUT}$ 52 keeps 'high' and up/down counter counts downward. During initial operation, the RESET signal from lead 54 sets the initial value before the calibration commences operation.

The circuit diagram of a calibrated bias block 24 (FIG. 6) includes an operational amplifier 72 and a calibrated resistor 74 in circuit with current mirrors 76 and 78. Included in parallel between P1 and P2 of the current mirror 76 for $I_{REF}$ is a DCL interface circuit 79 described in greater detail below in relation to FIG. 9. Calibrated resistor RCAL 74 is preferably constructed similarly to the calibrated resistor 30 described above and illustrated in FIG. 4. The voltage $V_X$ measured at a junction node 80 below the calibrated resistor 74 and connecting to the current mirror and the negative input 82 of the operational amplifier 72. $V_{REF}$ is provided at the positive input 84 of the operational amplifier 72. The voltage $V_X$ is set to $V_{REF}$ by the negative feedback through the operational amplifier 72 and current mirror 76. Current $I_2$ defined by line 86 is determined by (VDD−VREF)/RCAL and current $I_1$ defined by line 88 is determined by the ratio of N1 and N2 like $(W/L)_2/(W/L)_1 = I_2/I_1$ where W and L are width of length of transistor, respectively. Finally, $V_Y$ and $V_Z$ are determined by $I_1$. By virtue of the accurate $V_{REF}$ and $R_{CAL}$, one can achieve the accurate $I_{REF}$ which is the final reference current.

Figure 7:
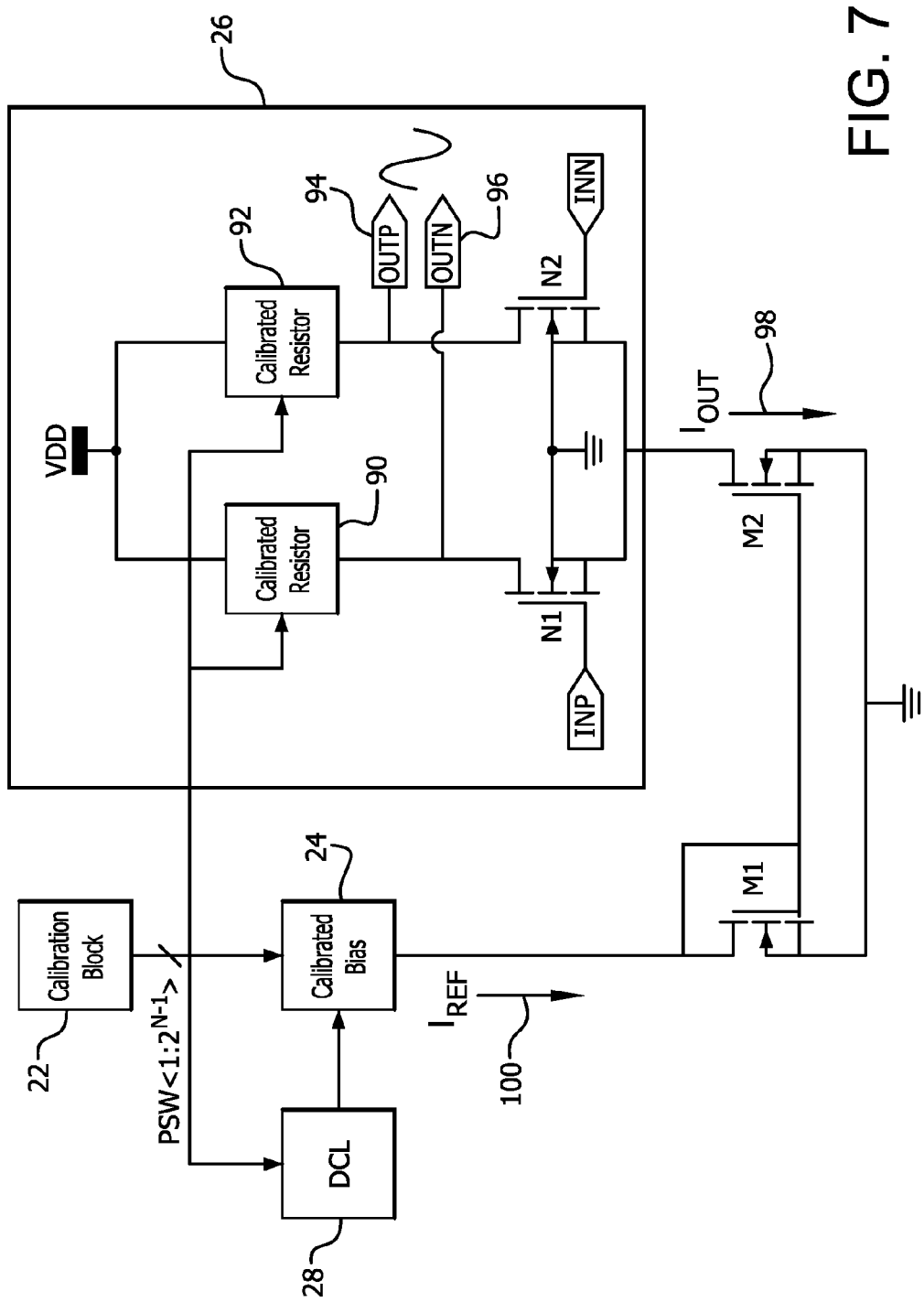
FIG. 7 is a block diagram of an output driver circuit of FIG. 1 according to the present invention.
Figure 8C:
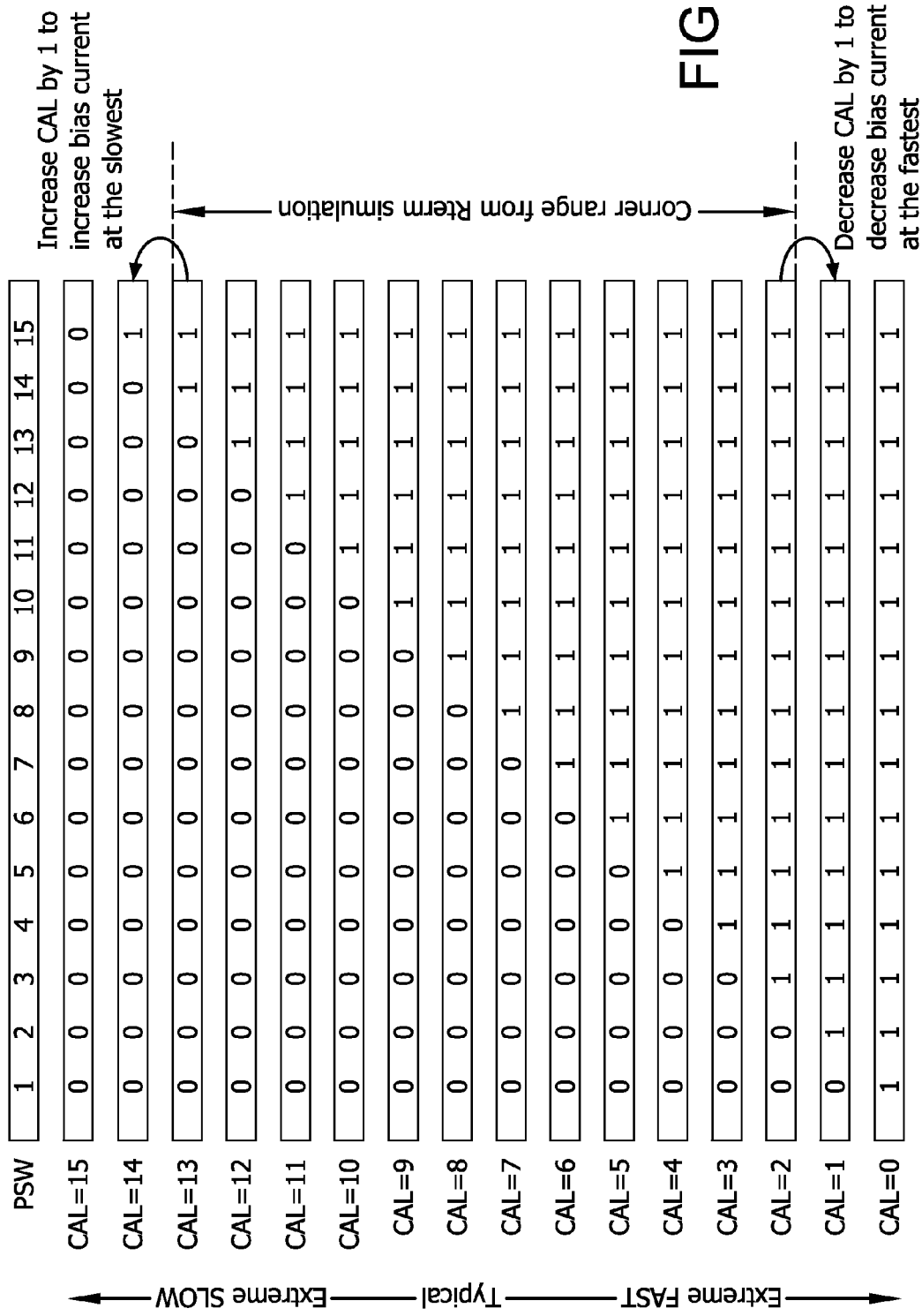
Figure 8D:
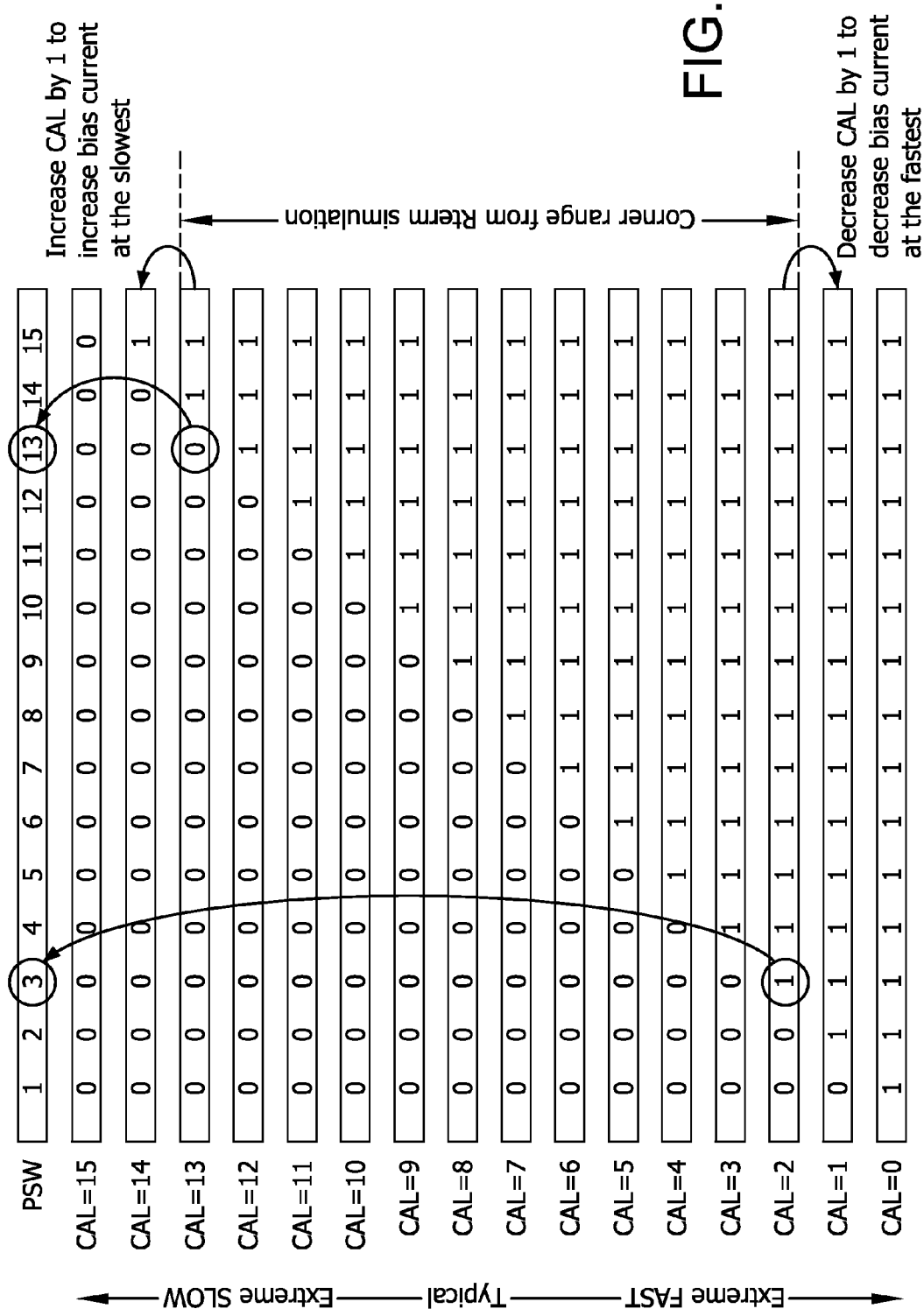

The detailed circuit inside output driver (FIG. 7) shown in the bias calibration circuit 20 of FIG. 1 connects to the current mirror (M1 and M2) and includes a differential pair (N1 and N2), calibrated resistors 90 and 92 which are calibrated by PSW<1:$2^{N-1}$> from calibration block. Differential voltage swing at OUTP 94 and OUTN 96 is generated through calibrated resistors by current $I_{OUT}$ 98 which is the tail current of M2. Current $I_{OUT}$ 98 is determined by current $I_{REF}$ 100 and size ratio of M1 and M2. Even though $I_{REF}$ 100 is not sensitive to process, voltage and temperature through calibration, $I_{OUT}$ 98 still experiences variations of process, voltage and temperature during current mirroring. Moreover, the voltage swing at OUTP 94 and OUTN 96 affects Vds of M2 and makes more variation in $I_{OUT}$ 98 as voltage swing becomes bigger because of headroom of M2.

The digital compensation logic provides compensation to $I_{REF}$ 100 to compensate for the variations due to the process, voltage and temperature by looking up the calibration code outputted by the calibration block 22 and subsequently generates DCC (Digital Compensation Codes) to the calibrated bias in order to compensate the variations cross the PVT (Process, Voltage, Temperature) corners.

With reference to FIGS. 8A-D, the DCL looks up the calibration code, PSW<1:$2^{N-1}$>, from calibration block 22 and can determine corner state of the chip because calibration code inherently provides information regarding corner variations. If calibrated resistor 74 is optimized to have the target resistance at the middle of N-bit in typical corner condition, the extreme corners will be shown at the edge of the code. For example, if a 4-bit binary calibration is applied to the application providing a range in decimals (DEC) from 0 to 15, and 7 (DEC) or 8 (DEC) are chosen to the optimal value for the target resistor in typical condition then extreme corner tends to have the lowest value (decimal 0) or the largest value (decimal 15) from up/down counter. X-axis and Y-axis represent PSW in binary and CAL in decimal, respectively. For example, as shown, if the design is optimized at CAL=8 for a typical corner then slow and fast corner tend to have the values close to 0 and 15 for CAL value, respectively. How far the calibrated code is separated from the middle code explains the depth of corners.

It will be appreciated by those skilled in the art that while a range of 0-15 defined by a 4-bit binary calibration circuit is currently implemented, but the number of bits selected may be designed to have a larger or smaller range as needed for sensitivity. While a minimal operational range of 0-2 may be used to achieve a minimal level of compensation where a typical corner is assigned a value of 1 and then slow and fast corners would have the values 0 and 2, respectively.

Normally, extreme slow corner like slow process, low voltage and high temperature has the value close to highest setting of CAL while extreme fast corner like fast process, high voltage and low temperature has the value close to lower setting of CAL. Now, DCC can adjust the amount of bias current, $I_{REF}$, to output driver to compensate the corner variation across PVT corner. In general, DCL is coded to boost and loosen $I_{REF}$ to output driver for the slow and fast corners, respectively because the current mirror generally in practice mirrors less current in the slow corner and higher current in the fast corner. The amount of compensated current depends on the simulation across the corners.

Figure 6:
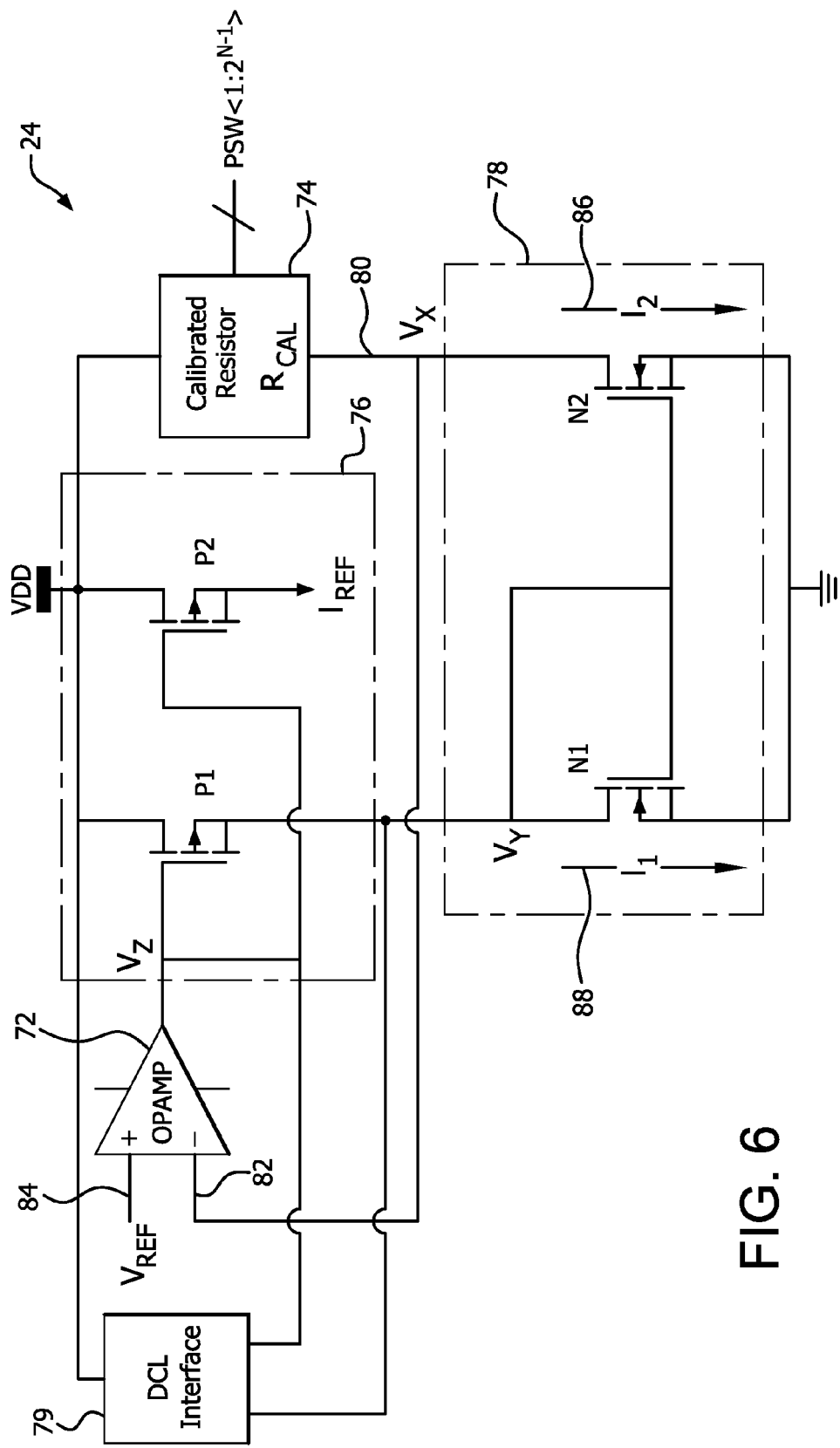
FIG. 6 is a block diagram of a calibrated bias circuit of FIG. 1 according to the present invention.

As reference in FIG. 6 above, FIG. 9 illustrates the calibrated block circuit of FIG. 6 and is illustrated so that like reference numerals refer to like structures and with greater emphasis on the disclosure of the DCL Interface 79 and introduces circuit connectivity with the DCL 28. The calibrated bias block 24 (FIG. 9) includes an operational amplifier 72 and a calibrated resistor 74 in circuit with current mirrors defined by transistor pairs P1-P2 and N1-N2. Digital Compensation Logic (DCL) to implement the compensated bias in the Calibrated Bias circuit using DCC which is generated from DCL. DCC controls the DCL interface circuit 79, as represented by switches $S_1$~$S_N$ 102-104, to adjust current $I_{REF}$ 100 according to the depth of corners within the current mirror of transistor pair P1-P2. The DCL interface circuit 79 is a compensated PMOS array, $PC_1$~$PC_N$ 108-110. As the corner becomes close to extreme slow corner, the more switches are turned off to increase $I_{REF}$. Similarly, as corner becomes close to fast corner, the more compensated switches are turned on to decrease $I_{REF}$. The size and number of compensated PMOS depends on design and corner variations. The DCL compensated current $I_{REF}$ is fed into output driver (FIG. 7) to compensate for the final voltage swing variation.

With reference to FIG. 10, it will be appreciated by those skilled in the art, that a stabilized output 112 is achieved through the contribution of two implementations derived from a conventional calibration technique, using calibration control logic 114 to handle calibration data extraction 116 as feedback for performing calibration 118 to achieve circuit calibration 120. Advantageously, the Digital Compensation Logic 28 uses the calibration data extraction 116 to determine corner sensitivity data processing 122 to determine corner sensitivity data extractions 124 for performing corner sensitivity compensation 126 to achieve corner sensitivity compensation 128. The contribution of both circuit calibration 120 and the corner sensitivity compensation 128 combine to provide greater stabilization of the output 112. Corner sensitivity refers to the impact of PVT corner variations experienced in semiconductor manufacturing on operational uniformity of the fabricated devices. Resulting in reducing the manufacturing tolerances and increasing of the manufacturing yields.

It will be appreciated by those skilled in the art that the use of this technique to vary $I_{REF}$ in accordance with the operational parameters of the circuit to account for corner variations across PVT corners in $I_{OUT}$ minimizes the variations of the tail current source of the differential pair by combining impedance calibration and selecting an appropriate calibration result. This invention minimizes the impact of PVT corner variations experienced in semiconductor manufacturing of serial data transmission systems where PVT corners represent the extremes of these parameter variations within which a circuit must function correctly which in turn improves the operational uniformity of the fabricated devices and can allow for a reduction in production losses due to parameter variations. This results in improved production capabilities and lower manufacturing costs with minimal variations in design and design costs.

In another exemplary embodiment, the hardware described above can be implemented using a processor executing instruction from a non-transitory storage medium. Those skilled in the art can appreciate that the instructions are created using a hardware description language (HDL) that is a code for describing a circuit. An exemplary use of HDLs is the simulation of designs before the designer must commit to fabrication. The two most popular HDLs are VHSIC Hardware Description Language (VHDL) and VERILOG. VHDL was developed by the U.S. Department of Defense and is an open standard. VERILOG, also called Open VERILOG International (OVI), is an industry standard developed by a private entity, and is now an open standard referred to as IEEE Standard 1364. A file written in VERILOG code that describes a Joint Test Access Group (JTAG) compliant device is called a VERILOG netlist. VHDL is an HDL defined by IEEE standard 1076.1. Boundary Scan Description Language (BSDL) is a subset of VHDL, and provides a standard machine- and human readable data format for describing how an IEEE Std 1149.1 boundary-scan architecture is implemented and operates in a device. Any HDL of the types described can be used to create instructions representative of the hardware description.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A system comprising:
   a stabilizing circuit connected to an output driver of a data transmission; and
   said stabilizing circuit including a digital compensation logic circuit to control corner variations;
   said stabilizing circuit includes a calibration circuit having a calibration logic circuit to control a calibrated resister circuit for generating a bias current;
   said digital compensation logic circuit adapted to receive a digital calibration signal to determine a corner state, and adjust said bias current based upon said corner state;
   said corner state is within a range of faster to slower extreme corners than a selected corner state;
   said digital compensation logic circuit decreases said bias current for faster corner state and increases bias current for slower corner states;
   said corner state is determined according to a n-bit compensation table defining a range of $2^n$ corner states; and
   said digital compensation logic circuit generates variations of said bias current.

2. The system of claim 1 wherein said digital compensation logic circuit includes a MOS array connected to said calibrated resistor circuit to adjust said calibrated resistance circuit in response to a corner state.

3. A system comprising:
   a stabilizing circuit connected to an output driver of a data transmission; and
   said stabilizing circuit including a digital compensation logic circuit to control corner variations;
   said stabilizing circuit includes a calibration circuit having a calibration logic circuit to control a calibrated resister circuit for generating a bias current;
   said digital compensation logic circuit adapted to receive a digital calibration signal to determine a corner state, and adjust said bias current based upon said corner state;
   said corner state is within a range of faster to slower extreme corners than a selected corner state;
   said digital compensation logic circuit decreases said bias current for faster corner states and increases bias current for slower corner states;
   said corner state is determined according to a compensation table defining a fast corner state, a selected corner state and a slow corner state; and
   said digital compensation logic circuit generating a decreased bias current adjustment, no bias current adjustment and an increased bias current adjustment.

4. The system of claim 3 wherein said digital compensation logic circuit includes a MOS array connected to said calibrated resistor circuit to adjust said calibrated resistance circuit in response to a corner state.

5. A bias compensation circuit comprising:
   a compensation logic circuit operative to vary a bias current used in a current mirror to stabilize an output driver of a data transmission system;
   said compensation logic circuit is responsive to an n-bit digital signal representative of a corner state of said output driver; and
   said digital signal defines a range from 0 to $2^{(n-1)}$ bits corresponding to a range of slow to fast corner states.

6. The bias compensation circuit of claim 5 wherein a typical corner state is mid-range of said digital signal.

7. The bias compensation circuit of claim 5 wherein said digital signal is generated by a calibrated bias circuit, and said bias compensation logic circuit adjusts said calibrated bias circuit to vary said bias current.

8. The bias compensation circuit of claim 5 wherein:
   said bias current is generated by a calibrated bias block; and
   said compensation logic circuit is connected to said calibrated bias block to signal said calibrated bias block to vary said bias current relative to a corner state speed.

9. The bias compensation circuit of claim 8 wherein a corner state speed faster than a typical corner state results in a decreased bias current and a corner state speed faster than a typical corner state results in an increased bias current.

10. A method comprising:
    providing a stabilizing circuit connected to an output driver of a data transmission;
    controlling corner variations using a digital compensation logic circuit included in said stabilizing circuit;
    controlling a calibrated resister circuit for generating a bias current using a calibration circuit having a calibration logic circuit included in said stabilizing circuit;
    said digital compensation logic circuit receiving a digital calibration signal to determine a corner state, and adjusting said bias current based upon said corner state;
    said corner state is within a range of faster to slower extreme corners than a selected corner state;
    said digital compensation logic circuit decreasing said bias current for faster corner states and increasing bias current for slower corner states;
    determining said corner state according to a n-bit compensation table defining a range of $2^n$ corner states; and
    said digital compensation logic circuit generating variations of said bias current.

11. A method for use in a bias compensation circuit comprising:
    providing a compensation logic circuit for varying a bias current used in a current mirror for stabilizing an output driver of a data transmission system;
    said compensation logic circuit responding to an n-bit digital signal representative of a corner state of said output driver; and
    said digital signal defining a range from 0 to $2^{(n-1)}$ bits corresponding to a range of slow to fast corner states.

* * * * *

UNITED STATES PATENT AND TRADEMARK OFFICE
CERTIFICATE OF CORRECTION

PATENT NO. : 8,604,826 B2  
APPLICATION NO. : 13/328322  
DATED : December 10, 2013  
INVENTOR(S) : Cho et al.

Page 1 of 1

It is certified that error appears in the above-identified patent and that said Letters Patent is hereby corrected as shown below:

ON THE TITLE PAGE:

Item (75), line 2, change "Stouffville, CA (US)" to -- Stouffville, Ontario (CA) --.

IN THE CLAIMS:

In claim 1, column 7, line 16, change "state" to -- states --.

Signed and Sealed this  
Twenty-fifth Day of March, 2014

Michelle K. Lee  
*Deputy Director of the United States Patent and Trademark Office*